(12) United States Patent
Takahashi et al.

(10) Patent No.: US 8,933,349 B2
(45) Date of Patent: Jan. 13, 2015

(54) ELECTRICAL APPARATUS AND MANUFACTURING PROCESS OF THE SAME

(75) Inventors: Kei Takahashi, Kanagawa (JP); Hirohisa Kubota, Saitama (JP); Tamotsu Tetsuchikawara, Kanagawa (JP)

(73) Assignees: Sony Corporation, Tokyo (JP); Sony Computer Entertainment Inc., Tokyo (JP)

( * ) Notice: Subject to any disclaimer, the term of this patent is extended or adjusted under 35 U.S.C. 154(b) by 188 days.

(21) Appl. No.: 13/485,989

(22) Filed: Jun. 1, 2012

(65) Prior Publication Data

US 2012/0307433 A1    Dec. 6, 2012

(30) Foreign Application Priority Data

Jun. 3, 2011 (JP) .................... 2011-125872

(51) Int. Cl.
*H01R 13/502* (2006.01)
*H05K 5/00* (2006.01)

(52) U.S. Cl.
CPC .................... *H05K 5/0013* (2013.01)
USPC .................... 174/561; 174/563

(58) Field of Classification Search
USPC .................... 174/563, 564, 561
See application file for complete search history.

(56) References Cited

U.S. PATENT DOCUMENTS

| | | | |
|---|---|---|---|
| 7,141,330 B2 | 11/2006 | Aoyama | |
| 7,399,719 B2* | 7/2008 | Hanan et al. | 442/136 |
| 7,563,992 B2* | 7/2009 | Lawlyes et al. | 174/561 |
| 2003/0211382 A1 | 11/2003 | Aoyama | |
| 2007/0103850 A1* | 5/2007 | Melman et al. | 361/679 |
| 2007/0202956 A1 | 8/2007 | Ogasawara | |
| 2008/0278892 A1* | 11/2008 | Chen et al. | 361/679 |

FOREIGN PATENT DOCUMENTS

| | | |
|---|---|---|
| CN | 1442912 A | 9/2003 |
| JP | 2001325930 A | 11/2001 |
| JP | 2003257388 A | 9/2003 |
| JP | 2009111600 A | 5/2009 |
| JP | 2010147094 A | 7/2010 |

OTHER PUBLICATIONS

Office Action for corresponding Japanese Patent Application No. 2011-125872, dated Apr. 16, 2013.
Office Action for corresponding CN application 201210181158.4, dated Aug. 5, 2014.

* cited by examiner

*Primary Examiner* — Hung V Ngo
(74) *Attorney, Agent, or Firm* — Matthew B. Dernier, Esq.; Gibson & Dernier LLP

(57) ABSTRACT

An electrical apparatus includes a first half case and a second half case. An end surface at an edge of the first half case and an end surface of the second half case are welded to each other. The first half case has an engaged portion inside thereof. The second half case has, inside thereof, an engaging portion which engages with the engaged portion so as to restrain relative movement of the first half case and the second half case in a direction in which the first half case and the second half case are separated. With this structure, strength of combination of the two half cases can be improved.

8 Claims, 4 Drawing Sheets

ELECTRICAL APPARATUS AND MANUFACTURING PROCESS OF THE SAME

CROSS-REFERENCE TO RELATED APPLICATION

The present application claims priority from Japanese application JP 2011-125872 filed on Jun. 3, 2011 the content of which is hereby incorporated by reference into this application.

BACKGROUND OF THE INVENTION

1. Field of the Invention

The present invention relates to an electrical apparatus such as a power adapter and particularly to a technique for improving strength of a case housing a circuit board.

2. Description of the Related Art

Conventionally, electronic devices such as portable game devices and portable personal computers are used (for example, U.S. Patent Application Publication No. 2007/0202956). The electronic devices are supplied with power through a power adapter when these devices are charged or used. The case of an electrical apparatus such as a power adapter is often formed by combining two members (hereinafter referred to as half cases) each of which has a shape obtained by halving a box. Edges of the two half cases are welded to each other, for example, by ultrasonic welding.

SUMMARY OF THE INVENTION

However, since the area of the welding surface is limited, it is difficult to improve the strength of combination of the two half cases by welding alone.

An electrical apparatus according to an aspect of the invention includes a case made of a resin and having a box-shape; a first half case and a second half case which are combined together to constitute the case, the first half case and the second half case having, at edges thereof, end surfaces welded to each other; an engaged portion formed inside the first half case; and, an engaging portion formed inside the second half case, the engaging portion engaging with the engaged portion so as to restrict relative movement of the first half case and the second half case in a direction in which the first half case and the second half case are separated. According to the electrical apparatus, not only the two end surfaces are welded to each other but the engaging portion and the engaged portion are engaged with each other. Therefore, the strength of combination of the two half cases can be improved.

A manufacturing process according to an aspect of the invention is used for manufacturing an electrical apparatus which includes a case having a box shape and formed by combining a first half case and a second half case. The manufacturing process includes a molding step of molding the first case half and the second case half out of a resin, and a combining step of combining the first case half and the second case half together which are molded in the molding step. In the molding step, end surfaces facing each other are formed at an edge of the first case half and an edge of the second case half. The end surface of the first case half has a melting protrusion formed thereon and protruding toward the end surface of the second case half. Moreover, the first case half and the second case half have an engaged portion and an engaging portion respectively formed inside thereof which is engageable with each other so as to restrain relative movement of the first case half and the second case half in a direction in which the first case half and the second case half are separated. The combining step includes a welding preparation step of bringing the melting protrusion into contact with the end surface of the second case half and engaging the engaging portion and the engaged portion with each other. The combining step also includes a welding step of melting the melting protrusion formed on the end surface of the first case half and thereby welding the end surface of the first case half and the end surface of the second case half to each other. According to the manufacturing process, not only the two end surfaces are welded to each other but the engaging portion and the engaged portion are engaged with each other. Therefore, the combination strength of the two half cases can be improved.

BRIEF DESCRIPTION OF THE DRAWINGS

FIG. 3 shows a state before a first half case and a second half case are combined together.

DETAILED DESCRIPTION OF THE PREFERRED EMBODIMENTS

Figure 1:
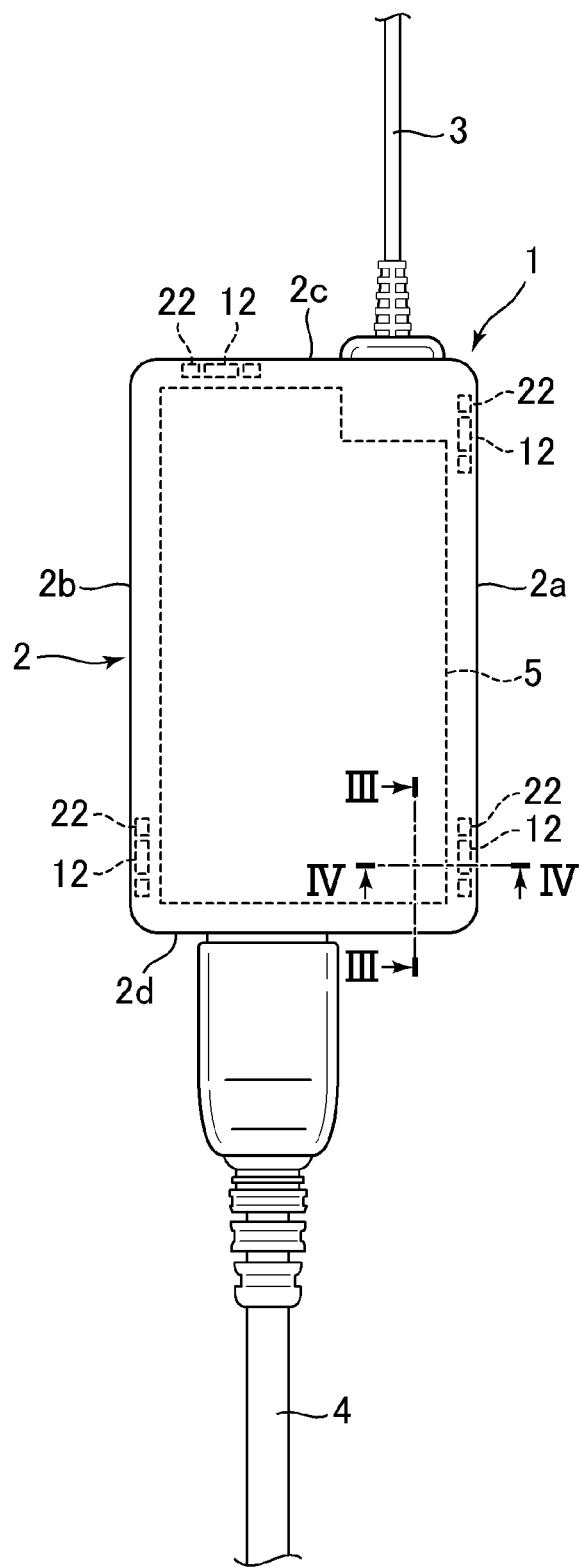
FIG. 1 is a plan view of an electrical apparatus according to an embodiment of the invention.
Figure 2:
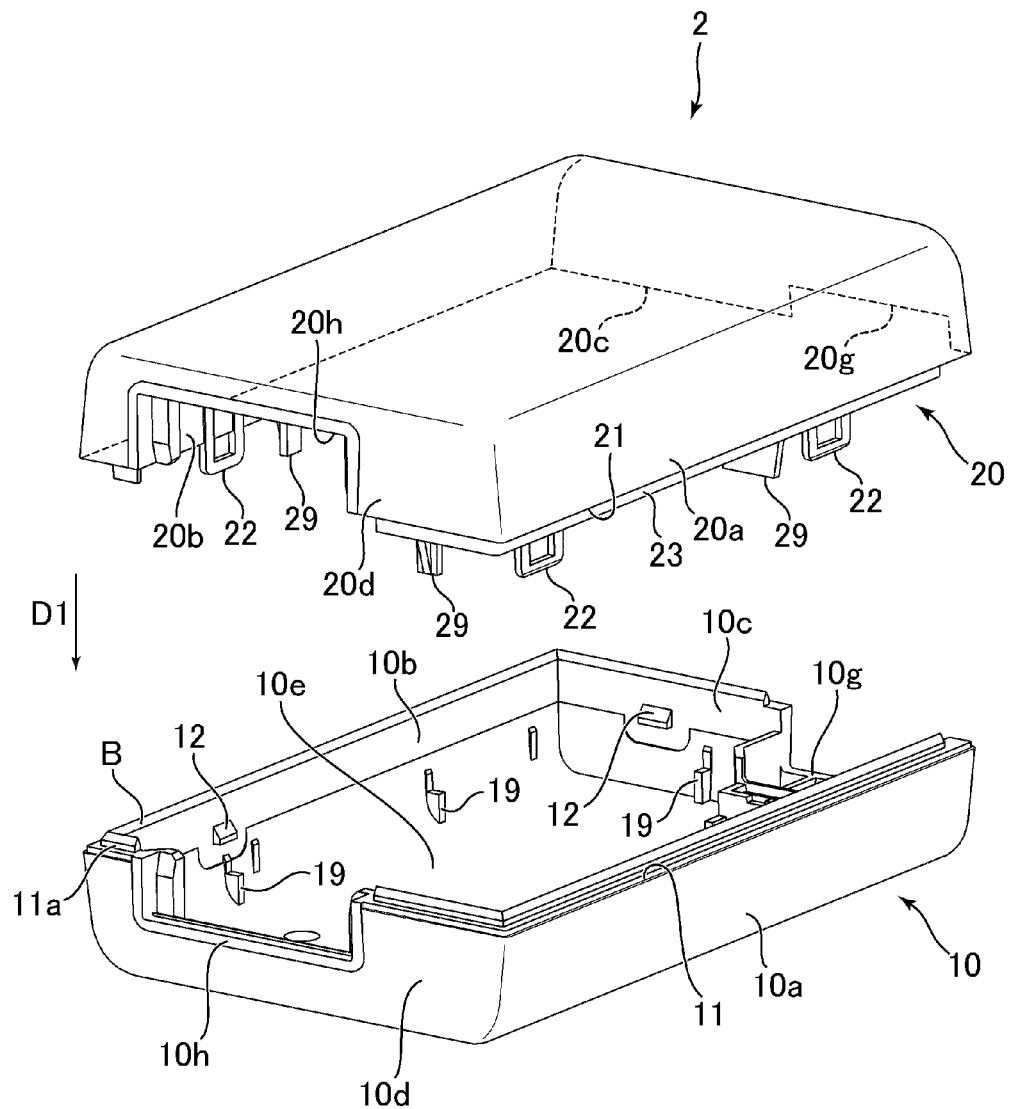
FIG. 2 is an exploded perspective view of a case which the electrical apparatus includes.
Figure 3:
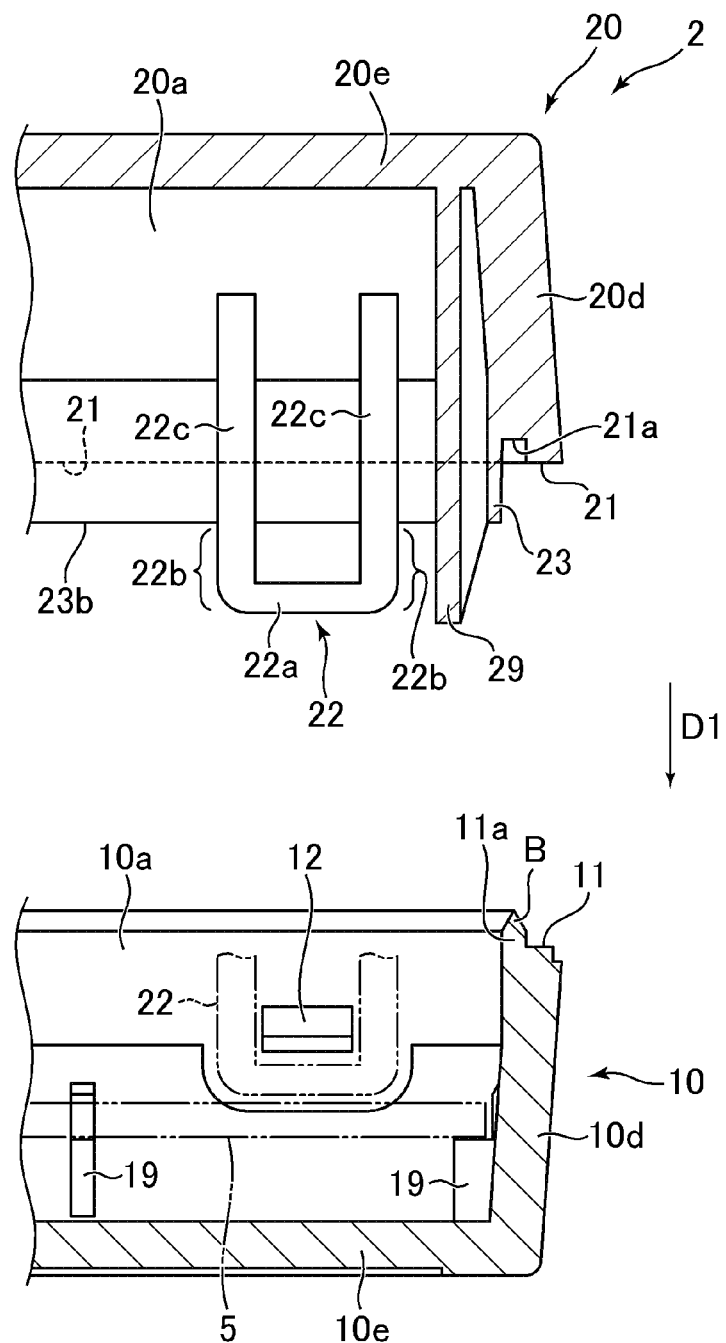
FIG. 3 is a sectional view of the case taken along line III-III in FIG. 1.
Figure 4:
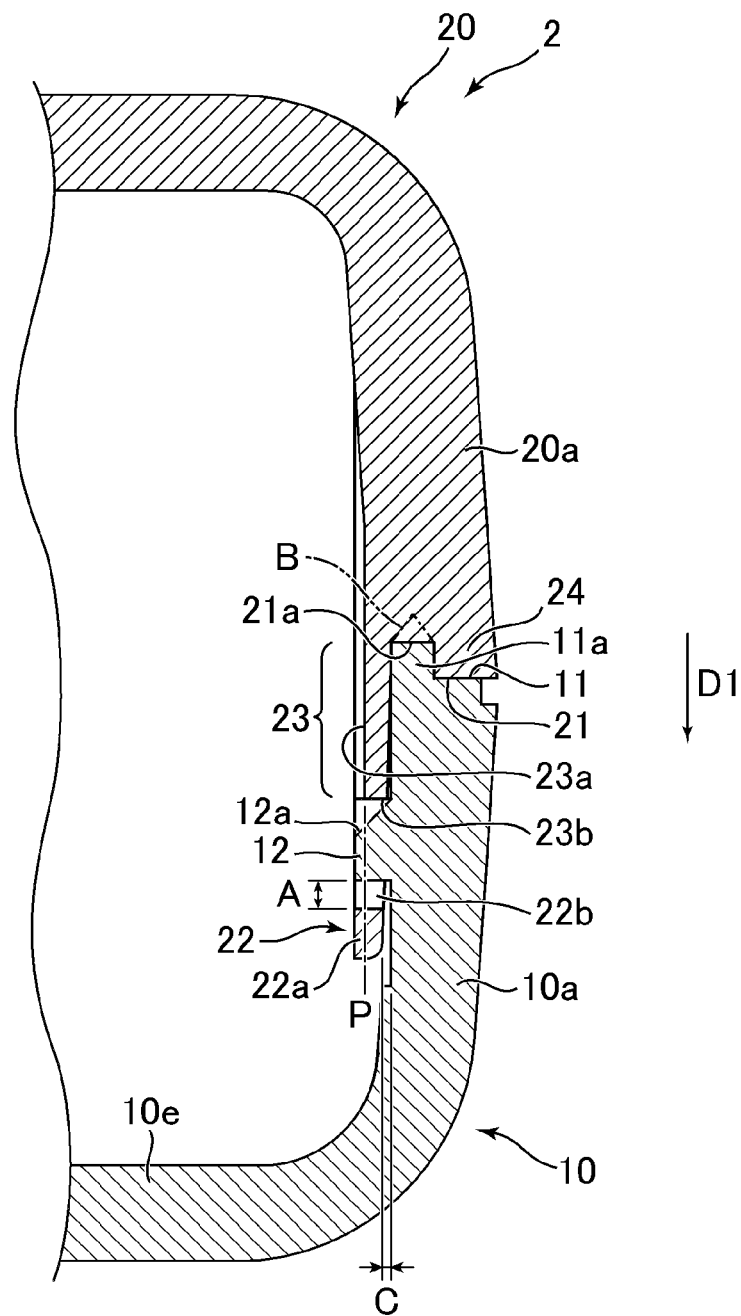
FIG. 4 is a sectional view of the case taken along line IV-IV in FIG. 1.

Hereinafter, an embodiment of the invention will be described with reference to the drawings. FIG. 1 is a plan view of an electrical apparatus 1 according to an embodiment of the invention. FIG. 2 is an exploded perspective view of a case 2 which the electrical apparatus 1 includes. FIG. 3 is a sectional view of the case 2 taken along line III-III in FIG. 1. FIG. 4 is a sectional view of the case 2 taken along line IV-IV in FIG. 1. In FIG. 2 and FIG. 3, a first half case 10 is shown in a state before the first half case 10 and a second half case 20 are combined together. Further, FIG. 2 and FIG. 3 shows a melting protrusion B which melts when the first half case 10 and the second half case 20 are welded to each other.

The electrical apparatus 1 in this example is a power adapter which is connected to a portable electronic device such as a personal computer or game device and converts AC power obtained from a power supply to DC power with an operating voltage of the electronic device. Therefore, a first cable 3 connected to the electronic device and a second cable 4 connected to the power supply are connected to the electrical apparatus 1 in this example, as shown in FIG. 1.

As shown in FIG. 1, the electrical apparatus 1 has a circuit board 5 and a case 2 housing the circuit board 5. The case 2 is molded out of a resin and has a box shape. The case 2 is substantially a cuboid having four lateral side surfaces 2a, 2b, 2c, 2d. In this example, the first cable 3 and the second cable 4 are connected respectively to the lateral side surfaces 2c, 2d situated opposite each other.

As shown in FIG. 2, the case 2 has the first half case 10 and the second half case 20 that become combined together to constitute the case 2. Each of the first half case 10 and the second half case 20 has roughly a shape obtained by halving a cuboidal box along a plane. That is, the first half case 10 has substantially a box-like shape opening toward the second half case 20. The second half case 20 has a substantially box-like shape opening toward the first half case 10. As shown in FIG. 2 and FIG. 3, plural ribs 19 for supporting the circuit board 5 are formed on a bottom portion of the first half case 10. The second half case 20 has plural ribs 29 formed therein for holding the circuit board 5 between the ribs 19 and the ribs 29.

As shown in FIG. 2, the first half case 10 and the second half case 20 include sidewall portions 10a, 20a, respectively, which constitute the lateral side surface 2a of the case 2. Similarly, the first half case 10 has sidewall portions 10b, 10c, 10d constituting the lateral side surfaces 2b, 2c, 2d of the case 2, respectively. The second half case 20 has sidewall portions 20b, 20c, 20d constituting the lateral side surfaces 2b, 2c, 2d of the case 2, respectively. Further, the first half case 10 and the second half case 20 includes bottom wall portions 10e and 20e facing each other, respectively. As shown in FIG. 3 and FIG. 4, the sidewall portions 10a to 10d of the first half case 10 and the sidewall portions 20a to 20d of the second half case 20 have, at edges thereof, end surfaces 11, 21 facing each other in a direction in which the first half case 10 and the second half case 20 are combined together (the direction is denoted with D1, hereinafter referred to a combination direction).

The end surface 11 and the end surface 21 are welded to each other. The half cases 10, 20 are molded, for example, out of a thermoplastic resin. The end surface 11 and the end surface 21 are welded to each other, for example, by ultrasonic welding. In this example, as described later, a groove 21a is formed on the end surface 21 and a fitting protrusion 11a is formed on the end surface 11 and fits in the groove 21a. A top surface of the fitting protrusion 11a, which is a portion of the end surface 11, is welded to a bottom surface of the groove 21a, which is a portion of the end surface 21.

As shown in FIG. 3 and FIG. 4, the first half case 10 includes an engaged portion 12 inside the sidewall portion 10a. The second half case 20 includes an engaging portion 22 inside the sidewall portion 20a. The engaging portion 22 engages with the engaged portion 12 so as to restrict relative movement of the first half case 10 and the second half case 20 in a direction in which the first half case 10 and the second half case 20 are separated (the direction in which the half cases 10, 20 are separated is opposite to the combination direction D1). That is, when the first half case 10 and the second half case 20 are about to move relatively in a separating direction (opposite to D1), the engaged portion 12 is hooked and restricts the movement. In this example, as shown in FIG. 1, plural engaged portions 12 (in this example, two engaged portions 12) are formed on the sidewall portion 10a and plural engaging portions 22 (in this example, two engaging portions 22) are formed on the sidewall portion 20a, too. Moreover, an engaged portion 12 and an engaging portion 22 are formed respectively on the sidewall portions 10c, 20c constituting the lateral side surface 2c of the case 2, and an engaged portion 12 and an engaging portion 22 are formed respectively on the sidewall portions 10b, 20b constituting the lateral side surface 2b. With this structure, the strength of combination of the half cases 10, 20 can be increased, compared with a structure in which the two half cases 10, 20 are combined together simply by welding the end surfaces 11, 21 to each other.

The engaging portion 22 extends in the combination direction D1 from each of the inner surfaces of the sidewall portion 20a, 20b, 20c. The engaging portion 22 in this example is in a shape of arm extending toward the first half case 10 beyond the end surface 21 of the second half case 20, as shown in FIG. 3 and FIG. 4. The engaged portion 12 is situated away from the end surface 11 toward the bottom wall portion 10e of the first half case 10. The engaging portion 22 is formed so that the engaged portion 12 can be hooked on an end portion 22a of the engaging portion 22. The end portions 22a of the engaging portion 22 abuts on the engaged portion 12 when the first half case 10 and the second half case 20 are about to move relatively in the separating direction (opposite to D1). The end portion 22a is situated closer to the bottom wall portion 10a of the first half case 10 than the engaged portion 12 is. Since the engaging portion 22 is thus formed in the arm shape, the distance from the end surfaces 11, 21 to an engaging position between the engaged portion 12 and the engaging portion 22 can be adjusted. Consequently, the distance can be determined so that even when an external force is applied to the vicinity of the end surfaces 11, 21, the influence of the external force on the engagement between the engaged portion 12 and the engaging portion 22 can be reduced. Thus, the strength of combination of the two half cases 10, 20 can be increased further.

As shown in FIG. 3, the engaging portion 22 in this example includes a pair of arm portions 22b. The two arm portions 22b are connected by the end portion 22a. That is, the engaging portion 22 is a substantially U-shaped. With this shape of the engaging portion 22, the strength of the engaging portion 22 can be increased. Further, since the engaging portion 22 has a shape of extending arm, the distance from the end surfaces 11, 21 to the engaging position between the engaged portion 12 and the engaging portion 22 can be adjusted. Meanwhile, the engaged portion 12 protrudes toward the inside of the case 2 from an inner surface of the sidewall portion 10a, 10b, 10c of the first half case 10 (see FIG. 4). In the state where the engaging portion 22 and the engaged portion 12 are engaged with each other, the engaged portion 12 is situated inside the engaging portion 22, as indicated by a double dotted line in FIG. 3. As shown in FIG. 3 and FIG. 4, the engaging portion 22 in this example includes base portions 22c. The base portions 22c extend from the arm portions 22b toward a side opposite to the first half case 10 and protrudes from the inner surface of the sidewall portion 20a, 20b, 20c of the second half case 20. The base portions 22c can further increase the strength of the arm portions 22b. The engaged portion 12 has a sloped surface 12a inclined with respect to the combination direction D1, as shown in FIG. 4. The slant surface 12a enables the end portion 22a of the engaging portion 22 to get over the engaged portion 12 easily when the first half case 10 and the second half case 20 are combined together in manufacturing process of electrical apparatus 1.

As shown in FIG. 2 and FIG. 4, the second half case 20 has, at edges of the sidewall portions 20a to 20d thereof, an inner protrusion 23 which protrudes toward the first half case 10 and fits inside the edge of the first half case 10. The inner protrusion 23 is formed like a wall along the edge of the first half case 10. The inner protrusion 23 in this example is formed over the entire perimeter of the edge of the second half case 20. The arm portions 22b of the engaging portion 22 extend toward the first half case 10 from the inner protrusion 23. With this structure, the inner protrusion 23 can reinforce the arm portions 22b. Moreover, when the electrical apparatus 1 is manufactured, the first half case 10 and the second half case 20 can fit with each other easily. As described later, the inner protrusion 23 also functions as a sidewall of the groove 21a formed on the end surface 21 welded to the end surface 11, and therefore the inner protrusion 23 can increase the strength of welding between the end surfaces.

As shown in FIG. 4, the engaging portion 22 extends along the inner surface of the sidewall portion 10a, 10b, 10c of the first half case 10. A clearance C in the direction of the thickness of the sidewall portion 10a, 10b, 10c is provided between the engaging portion 22 and the inner surface of the sidewall portion 10a, 10b, 10c. With this structure, when the first half case 10 and the second half case 20 are welded to each other in the manufacturing process of the electrical apparatus 1, for example, by ultrasonic welding, heat can be generated by ultrasonic vibration concentratedly at a portion to be welded (in this example, the melting protrusion B, described later). In this example, the surface of the engaging portion 22 toward the sidewall portion 10a, 10b, 10c is inclined so that the clearance between the engaging portion 22 and the inner surface of the sidewall portion 10a, 10b, 10c gradually increases toward the end portion 22a of the engaging portion 22. The engaging portion 22 extends from the inner protrusion 23, as described above. The inner protrusion 23 and the inner surface of the sidewall portion 10a, 10b, 10c are in tight contact, whereas the clearance is provided between the engaging portion 22 and the inner surface of the sidewall portion 10a, 10b, 10c.

As shown in FIG. 3 and FIG. 4, a groove is formed on one of the end surfaces 11, 21 and a fitting protrusion to fit in this groove is formed on the other end surface. In this example, the groove 21a is formed on the end surface 21 of the second half case 20 and the fitting protrusion 11a is formed on the end surface 11 of the first half case 10, as described above. With this structure, the durability of the case 2 against an external force applied to the lateral side surfaces 2a to 2d of the case 2 can be improved. Also, before the end surface 11 and the end surface 21 are welded to each other, the first half case 10 includes the melting protrusion B protruding toward the end surface 21 from the fitting protrusion 11a, as shown in FIG. 2 and FIG. 3. In the step of welding the end surface 11 and the end surface 21, the melting protrusion B melts. In this step, the molten resin permeates between an outer surface of the fitting protrusion 11a and an inner surface of the groove 21a. Thus, the strength of welding can be increased, compared with a structure in which two flat surfaces are welded to each other.

As shown in FIG. 4, a clearance A in a direction opposite to the combination direction D1 is provided between the engaging portion 22 and the engaged portion 12. The clearance A in this example is the distance between the end portion 22a of the engaging portion 22 and the engaged portion 12 in the direction opposite to the combination direction D1. The clearance A is smaller than the height of the fitting protrusion 11a, that is, the depth of the groove 21a. With this structure, the end surface 21 and the end surface 11 can be restrained from separated from each other. An amount of protrusion (height) of the melting protrusion B is determined so as to achieve such a size of the clearance A.

As shown in FIG. 4, the second half case 20 has an outer protrusion 24 on the edge thereof. The second half case 20 also has, on the edge thereof, the above-mentioned inner protrusion 23 situated further inwardly from the outer protrusion 24. The outer protrusion 24 and the inner protrusion 23 function as the sidewalls of the groove 21a. That is, the groove 21a is formed between the outer protrusion 24 and the inner protrusion 23. In this example, the height of the inner protrusion 23 from the bottom surface of the groove 21a is greater than the height of the outer protrusion 24 from the bottom surface of the groove 21a. Therefore, an end surface 23b of the inner protrusion 23 is situated further downward than a lower surface of the outer protrusion 24 (that is, the end surface 21). Ad described above, the arm portions 22b of the engaging portion 22 extend downward toward the first half case 10 from the inner protrusion 23. Therefore, the strength of the arm portions 22b is secured, while the distance from the end surface 11, 21 to the end portion 22a of the engaging portion 22, that is, to the engaging position between the engaging portion 22 and the engaged portion 12, can be increased.

As shown in FIG. 3 and FIG. 4, the arm portions 22b of the engaging portion 22 extend from the end surface 23b of the inner protrusion 23. That is, the arm portions 22b overlap the end surface 23b of the inner protrusion 23 in a direction perpendicular to the direction of the thickness of the sidewall portion 20a, 20b, 20c, that is, in the combination direction D1. With this structure, reduction of a housing space in the case 2 due to the engaging portion 22 can be prevented. In this example, the arm portions 22b and the end portion 22a are offset outward of the case 2 with respect to the inner surface 23a of the inner protrusion 23 (the inner surface 23a is the surface facing the inside of the case 2). Referring to FIG. 4, the arm portions 22b and the end portion 22a are offset outward of the case 2 with respect to a plane P including the inner surface 23.

An opening is formed on the lateral side surface 2c of the case 2. Specifically, recessed portions 10g, 20g are formed at edges of the sidewall portions 10c, 20c of the half cases 10, 20, as shown in FIG. 2. These recessed portions 10g, 20g form the opening on the lateral side surface 2c. Inside the opening on the lateral side surface 2c, a connector to which the first cable 3 is connected is arranged. As described above, the engaged portion 12 and the engaging portion 22 are formed respectively on the sidewall portions 10c, 20c (see FIG. 1). With the layout of the engaged portion 12 and the engaging portion 22, the combination strength of the sidewall portions 10c, 20c, which tend to receive a force from the first cable 3, can be increased.

Recessed portions 10h, 20h are formed at edges of the sidewall portions 10d, 20d of the half cases 10, 20. The recessed portions 10h, 20h form an opening on the lateral side surface 2d which is larger than the opening on the lateral side surface 2c. Inside the opening on the lateral side surface 2d, a connector to which the second cable 4 is connected is arranged. As shown in FIG. 1, the engaged portion 12 and the engaging portion 22 are formed respectively on the sidewall portions 10b, 20b forming the lateral side surface 2b. The engaged portion 12 and the engaging portion 22 formed on the lateral side surface 2b are situated at a position close to the lateral side surface 2d on which the opening for the second cable 4 is formed. Thus, the combination strength of the sidewall portions 10d, 20d, which tend to receive a force from the second cable 4, can be increased.

A process for manufacturing the electrical apparatus 1 will be described.

First, each of the first half case 10 and the second half case 20 is molded out of a resin (specifically, a thermoplastic resin). The half cases 10, 20 are formed, for example, by injection molding. In this molding step, the end surfaces 11, 21 facing each other in the combination direction D1 are formed respectively on the edges of the sidewall portions 10a to 10d of the first half case 10 and on the edges of the sidewall portions 20a to 20d of the second half case 20. Also, in this molding step, the melting protrusion B protruding toward the end surface 21 is formed on the end surface 11. In this example, the fitting protrusion 11a is formed on the end surface 11, and the melting protrusion B is formed on the fitting protrusion 11a. As shown in FIG. 2 and FIG. 4, the melting protrusion B is formed into a peaked shape, that is, the melting protrusion B has a triangular cross-section. The groove 21a is formed on the end surface 21 of the second half case 20. Moreover, in the molding step, the engaged portions 12 and the engaging portions 22 that can engage with each other are formed respectively on the inner side of the sidewall portions 10a, 10b, 10c of the first half case 10 and on the inner side of the sidewall portions 20a, 20b, 20c of the second half case 20.

After that, the first half case 10 and the second half case are welded and thus combined together in the combination direction D1 (combining step). Specifically, in a welding preparation step, the melting protrusion B formed on the end surface 11 of the first half case 10 and the end surface 21 of the second half case 20 are brought in contact with each other. Further, in the step, the engaging portions 22 and the engaged portions 12 are engaged with each other so as to restrain relative movement of the first half case 10 and the second half case 20 in a direction in which the first half case 10 and the second half case 20 are separated, that is, in a direction opposite to the combination direction D1 of the first half case 10 and the second half case 20. As described above, the fitting protrusion 11a is formed on the end surface 11 and the groove 21a is formed on the end surface 21 in the preceding molding step. Therefore, in the welding preparation step, the melting protrusion B is fitted in the groove 21a. After the welding preparation step, the melting protrusion B is melted, thus welding the end surface 11 of the first half case 10 and the end surface of the second half case 20 to each other (welding step). Specifically, the end surface 11 and the end surface 21 are welded to each other by ultrasonic welding, as described above.

In the embodiment described above, the engaging portion 22 and the engaged portion 12 are molded in the molding step so that a clearance is generated between the engaging portion 22 and the engaged portion 12 when the melting protrusion B is in contact with the end surface 21 of the second half case 20 in the welding preparation step. In other words, the position of the end portion 22a and the position of the engaged portion 12 are determined in advance so that a gap in the combination direction D1 is generated between the end portion 22a of the engaging portion 22 and the engaged portion 12 when the top of the melting protrusion B is abutting on the bottom surface of the groove 21a. Thus, when the first half case 10 and the second half case 20 are welded to each other by ultrasonic welding, heat generated by ultrasonic vibration can be concentrated at the melting protrusion B. The clearance generated in the welding preparation step is smaller than the clearance A (see FIG. 4). When the melting protrusion B melts, the clearance between the end surface 22a and the engaged portion 12 expands and becomes the clearance A shown in FIG. 4.

As described above, the electrical apparatus 1 includes the first half case 10 and the second half case 20. The end surface 11 on the edge of the first half case 10 and the end surface 21 of the second half case 20 face each other and welded to each other in the direction D1 in which the first half case 10 and the second half case 20 are combined. The first half case 10 has the engaged portion 12 inside thereof. The second half case 20 has, inside thereof, the engaging portion 22. The engaging portion 22 engages with the engaged portion 12 so as to restrict relative movement of the first half case 10 and the second half case 20 in the direction in which the first half case 10 and the second half case 20 is separated. According to this electrical apparatus 1, the combination strength of the two half cases can be improved. When the first half case 10 and the second half case 20 are about to move relatively in the direction opposite to the combination direction D1, the clearance A between the end portion 22a of the engaging portion 22 and the engaged portion 12 is eliminated. That is, the end portion 22a is hooked on the engaged portion 12. Thus, relative movement of the first half case 10 and the second half case 20 is prevented.

Also, the groove 21a is formed on the end surface 21 of the second half case 20, and the end surface 11 of the first half case 10 has the fitting protrusion 11a fitting in the groove 21a. With this structure, the strength of welding of the two half cases can be improved.

Moreover, between the engaging portion 22 and the engaged portion 12, the clearance A that can be eliminated by relative movement of these portions in the direction opposite to the combination direction D1 is provided. The clearance A is smaller than the height of the fitting protrusion 11a. With this structure, generation of a gap between the end surface 21 and the end surface 11 can be restrained securely.

Also, the edge of the second half case 20 has the outer protrusion 24 functioning as one sidewall of the groove 21a, and the inner protrusion 23 functioning as the other sidewall of the groove 21a. The arm portions 22b of the engaging portion 22 extend from the inner protrusion 23 toward the first half case 10 and are formed so that the end surface 22a of the engaging portion 22 is hooked on the engaged portion 12. With this structure, the strength in welding of the end surfaces 21, 11 can be increased and the strength of the engaging portion 22 can be increased as well.

The arm portions 22b of the engaging portion 22 of the second half case 20 extend from the end surface 23b of the inner protrusion 23 toward the first half case 10. With this structure, reduction of the housing space in the case 2 due to the engaging portion 22 can be restrained.

Also, the height of the inner protrusion 23 from the bottom surface of the groove 21a is higher than the height of the outer protrusion 24 from the bottom surface of the groove 21a. With this structure, the strength of the engaging portions 22 can be increased further.

Moreover, the engaging portion 22 of the second half case 20 has an arm shape extending toward the first half case 10 beyond the end surface 21 of the second half case 20. The engaging portion 22 are formed such that the end portions 22a thereof are hooked on the engaged portions 12. With this structure, a long distance from the end surfaces 11, 21 of the half cases 10, 20 to the engaging position between the engaged portion 12 and the engaging portion 22 can be secured. Thus, even when an external force is applied to the vicinity of the end surfaces 11, 21, the influence thereof on the engaging state between the engaged portion 12 and the engaging portion 22 can be reduced.

Also, the edge of the second half case 20 has the wall-like inner protrusion 23. The inner protrusion 23 fits inside the edge of the first half case 10 and is formed along the edge of the first half case 10. The arm portions 22b of the engaging portion 22 extend from the inner protrusion 23 toward the first half case 10. With this structure, the inner protrusion 23 can reinforce the engaging portion 22.

Moreover, the clearance C is provided between the engaging portion 22 and the inner surface of the first half case 10. With this structure, when the first half case 10 and the second half case 20 are welded to each other, for example, by ultrasonic welding, heat generated by ultrasonic vibration can be concentrated at the portion to be welded (in the above description, the melting protrusion B).

Furthermore, the process for manufacturing the electrical apparatus 1 includes the molding step of molding the first half case 10 and the second half case 20 out of a resin. In this molding step, the melting protrusion B protruding toward the end surface 21 of the second half case 20 is formed on the end surface 11 of the first half case 10. Further, in the molding step, the engaged portion 12 and the engaging portion 22, which can engage with each other for restraining relative movement of the first half case 10 and the second half case 20 in the direction in which they are separated, are formed respectively on the inner side of the first half case 10 and on the inner side of the second half case 20. The combining step includes the welding preparation step of bringing the melting protrusion B of the first half case 10 and the end surface 21 of the second half case 20 into contact with each other, and engaging the engaging portion 22 and the engaged portion 12. The combining step further includes the welding step of melting the melting protrusion B and thereby welding the end surface 11 of the first half case 10 and the end surface 21 of the second half case 20 to each other. According to the electrical apparatus 1 manufactured by this process, the strength of combination between the first half case 10 and the second half case 20 can be increased.

In the process for manufacturing the electrical apparatus 1, the engaging portion 22 and the engaged portion 12 are molded in the molding step such that the clearance is generated between the engaging portion 22 and the engaged portion 12 when the melting protrusion B is in contact with the end surface 21 of the second half case 20 in the welding preparation step. According to this process, when the first half case 10 and the second half case 20 are welded to each other in the welding step, for example, by ultrasonic welding, heat generated by ultrasonic vibration can be concentrated at the portion to be welded, that is, at the melting protrusion B.

The invention is not limited to the above electrical apparatus 1 and various changes can be made.

For example, in the above description, the height of the inner protrusion 23 from the bottom surface of the groove 21a is greater than the height of the outer protrusion 24 from the bottom surface of the groove 21a. However, the height of the inner protrusion 23 and the height of the outer protrusion 24 may be equal.

In the above description, the engaging portions 22 are substantially U-shaped. However, the shape of the engaging portion 22 is not limited to this example. The engaging portion 22 can be of any shape that enables the engaging portion 22 to be hooked on the engaged portion 12 when the first half case 10 and the second half case 20 are about to move in the direction opposite to the combination direction D1. For example, a protrusion may be formed at the distal end of the engaging portion 22, and a recessed portion in which the protrusion of the engaging portion 22 can fit may be formed, as the engaged portion, on the sidewall portions 10a, 10b, 10c of the first half case 10.

In the above description, the groove 21a is formed on the end surface 21 of the second half case 20 having the arm-shaped engaging portion 22, and the fitting protrusion 11a is formed on the first half case 10. However, a groove may be formed on the end surface 11 of the first half case 10, and a fitting protrusion may be formed on the second half case 20.

The invention claimed is:

1. An electrical apparatus, comprising:
a case made of a resin and having a box-shape;
a first half case and a second half case which are combined together to constitute the case, the first half case and the second half case having, at edges thereof, end surfaces welded to each other;
an engaged portion formed inside the first half case; and,
an engaging portion formed inside the second half case, the engaging portion engaging with the engaged portion so as to restrict relative movement of the first half case and the second half case in a direction in which the first half case and the second half case are separated,
wherein the engaging portion of the second half case has an arm shape extending toward the first half case beyond the end surface of the second half case and is formed so that the end portion thereof is hooked on the engaged portion,
wherein a clearance extending from the engaged portion to the tip of the engaging portion is provided between the engaging portion and an inner surface of a sidewall portion of said first case.

2. The electrical apparatus according to claim 1, wherein a groove is formed on one of the end surface of the second half case and the end surface of the first half case, and
the other of the end surface of the second half case and the end surface of the first half case has a fitting protrusion which fits in the groove.

3. The electrical apparatus according to claim 2, wherein the engaging portion and the engaged portion have a clearance therebetween which can be eliminated by the relative movement of the engaging portion and the engaged portion in the direction in which the first half case and the second half case are separated, and
the clearance is smaller than a height of the fitting protrusion.

4. The electrical apparatus according to claim 3, wherein the first half case and the second half case include bottom wall portions facing each other,
the clearance is formed between the engaged portion of the first half case and an end portion of the engaging portion of the second half case, wherein the end portion of the engaging portion is situated closer to the bottom wall portion of the first half case than the engaged portion is.

5. The electrical apparatus according to claim 2, wherein the groove is formed on the end surface of the second half case,
the second half case includes, at the edge thereof, an outer protrusion functioning as one sidewall of the groove and an inner protrusion functioning as the other sidewall of the groove, and
the engaging portion of the second half case extends from the inner protrusion toward the first half case and is formed so that the end portion of the engaging portion is hooked on the engaged portion.

6. The electrical apparatus according to claim 5, wherein the engaging portion of the second half case extends from an end surface of the inner protrusion toward the first half case.

7. The electrical apparatus according to claim 5, wherein a height of the inner protrusion from a bottom surface of the groove is higher than a height of the outer protrusion from the bottom surface of the groove.

8. The electrical apparatus according to claim 1, wherein the second half case includes, at the edge thereof, a wall-like inner protrusion which fits inside the edge of the first half case and which is formed along the edge of the first half case.

* * * * *